(12) United States Patent
Copley et al.

(10) Patent No.: US 10,172,230 B1
(45) Date of Patent: Jan. 1, 2019

(54) SURFACE MOUNT TECHNOLOGY DEVICE

(71) Applicants: Benjamin Andrew Copley, Linthicum, MD (US); Matthew S. Torpey, Ellicott City, MD (US); David J. Gillooly, Glen Burnie, MD (US); Justin B. Kennard, Liberty Township, OH (US); Andrew S. King, Baltimore, MD (US)

(72) Inventors: Benjamin Andrew Copley, Linthicum, MD (US); Matthew S. Torpey, Ellicott City, MD (US); David J. Gillooly, Glen Burnie, MD (US); Justin B. Kennard, Liberty Township, OH (US); Andrew S. King, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/621,733

(22) Filed: Jun. 13, 2017

(51) Int. Cl.
  *H05K 1/18* (2006.01)
  *H05K 1/02* (2006.01)
  *H05K 1/11* (2006.01)

(52) U.S. Cl.
  CPC ............ *H05K 1/0216* (2013.01); *H05K 1/111* (2013.01); *H05K 1/115* (2013.01); *H05K 1/181* (2013.01); *H05K 2201/0723* (2013.01)

(58) Field of Classification Search
  CPC .......... H01L 2924/01079; H05K 1/023; H05K 1/306; H05K 1/162; H05K 1/141
  USPC ................ 361/760–765, 777–784, 767, 803; 174/255–264
  See application file for complete search history.

(56) References Cited

U.S. PATENT DOCUMENTS

| | | | |
|---|---|---|---|
| 6,875,921 B1* | 4/2005 | Conn | H01L 23/50 174/534 |
| 6,949,992 B2 | 9/2005 | Sweeney et al. | |
| 7,348,842 B2 | 3/2008 | Ichitsubo et al. | |
| 2003/0159844 A1* | 8/2003 | Wolf | G02B 6/4201 174/388 |
| 2008/0229822 A1* | 9/2008 | Kato | G01C 19/574 73/504.12 |
| 2012/0218729 A1 | 8/2012 | Carey et al. | |

OTHER PUBLICATIONS

Ma, et al: "*Analysis on the Stealth Characteristic of Two Dimensional Cylinder Plasma Envelopes*"; Progress in Electromagnetics Research Letters, vol. 13, 83-92, 2010.

* cited by examiner

*Primary Examiner* — Tuan T Dinh
(74) *Attorney, Agent, or Firm* — Tarolli, Sundheim, Covell & Tummino LLP (57) ABSTRACT

A surface mount technology (SMT) device can include an SMT interface on a given side of the SMT device. The SMT interface can include an interface ground plane formed of conductive material. The SMT interface can also include a plurality of signal pads formed of the conductive material. Each signal pad can be encircled by one of a plurality of isolation regions formed from a non-conductive region of the SMT interface. The SMT device is configured for mounting on a printed wiring board (PWB) that includes a board interface having substantially the same shape at the SMT interface.

17 Claims, 7 Drawing Sheets

SURFACE MOUNT TECHNOLOGY DEVICE

TECHNICAL FIELD

This disclosure relates to a surface mount technology device with an interface.

BACKGROUND

Electromagnetic interference (EMI), also called radio-frequency interference (RFI) when in the radio frequency spectrum, is a disturbance generated by an external source that affects an electrical circuit by electromagnetic induction, electrostatic coupling, or conduction. The disturbance may degrade the performance of the circuit or even stop the circuit from functioning properly. In the case of a data path, these effects can range from an increase in error rate to a total loss of the data. EMI can also affect mobile phones, FM radios and televisions.

Surface-mount technology (SMT) is a method for producing electronic circuits in which the components are mounted or placed directly onto the surface of printed wiring boards (PWBs), which may also be referred to as a printed circuit board (PCB). An electronic device so made is sometimes referred to as a surface-mount device (SMD) or an SMT device. SMT has largely replaced the through-hole technology construction method of fitting components with wire leads into holes in the circuit board.

A Faraday cage or Faraday shield is an enclosure used to block electromagnetic fields. A Faraday cage may be formed by a continuous covering of conductive material or in the case of a Faraday cage, by a mesh of such materials. A Faraday cage operates because an external electrical field causes the electric charges within the cage's conducting material to be distributed such that they cancel the field's effect in the cage's interior. In some situations, Faraday cages are employed to enclose devices that produce RFI, such as radio frequency (RF) components, such as transmitters, amplifiers, couplers, etc. to prevent their radio waves from interfering with other nearby equipment, including components mounted on the same PWB.

SUMMARY

One example relates to a surface mount technology (SMT) device that can include an SMT interface on a given side of the SMT device. The SMT interface can include an interface ground plane formed of conductive material extending to about each edge of the given side of the SMT device. The SMT interface can also include a plurality of signal pads formed of the conductive material. Each signal pad can be encircled by one of a plurality of isolation regions formed from a non-conductive region of the SMT interface. The SMT device is configured for mounting on a printed wiring board (PWB) that includes a board interface having substantially the same shape at the SMT interface.

Another example relates to a PWB that includes a board interface configured to receive an SMT device. The board interface has a substantially rectangular shape. The board interface can include an interface ground plane formed of conductive material extending to about each edge of the board interface. The board interface can also include a plurality of signal pads formed of the conductive material. Each signal pad is circumscribed by one of a plurality of isolation regions formed from a non-conductive region of the board interface. The SMT device includes an SMT interface that has substantially the same shape at the board interface.

Yet another example relates to an apparatus that includes an SMT device comprising an SMT interface on a given side of the SMT device. The SMT interface includes a ground plane formed of conductive material extending to about each edge of the given sides of the SMT device. The SMT interface can also include a signal pad formed of the conductive material, the signal pad being encircled by an isolation region formed from a non-conductive region of the SMT interface. The apparatus can also include a PWB having a board interface having substantially a same shape as the SMT interface. The SMT device is mounted on the PWB at the location of the board interface forming a SMT coax launch that electrically couples the signal pad of the SMT device to a signal pad on the board interface.

DETAILED DESCRIPTION

This disclosure relates to a circuit assembly that includes a surface mount technology (SMT) device. The SMT device includes an SMT interface on a given side of the SMT device, the SMT interface has a ground plane formed of conductive material that can extend to (nearly) each of the edges of the given side of the SMT device. The SMT interface includes a signal pad (or a plurality of signal pads) formed of the conductive material that encircled by an isolation region formed from a non-conductive material or an absence of conductive material. The circuit assembly also includes a printed wiring board (PWB) having a board interface having substantially the same shape as the SMT interface. The SMT device is mounted on the PWB at the location of the board interface forming a SMT coax launch that electrically/conductively couples the signal pad of the SMT device to a signal pad on the board interface. The SMT interface and the board interface can be adhered together by a conductive adhesive, such as solder or epoxy.

The SMT interface and the board interface are shaped to prevent radio frequency (RF) leakage of signals transmitted between the signal pad of the SMT device and the signal pad of the PWB. Additionally, the configuration of the SMT coax launch (which includes the SMT interface and the board interface adhered together), obviates the need for an external electromagnetic interference (EMI) shield (e.g., a Faraday cage, or hut). The SMT coax launch employs a pseudo-coax relationship to interface between the SMT part and the board. Thus, the SMT device can be placed and soldered to the PWB using the same SMT process currently used on an automated fabrication line just like any other SMT part. As a result of using the new SMT coax launch, tuning is simple and the device footprint does not extend significantly beyond the SMT device in contrast to SMT devices with external EMI shields. Accordingly, this reduces the amount of PWB real estate (e.g., the footprint) needed to for the SMT device.

Figure 1:
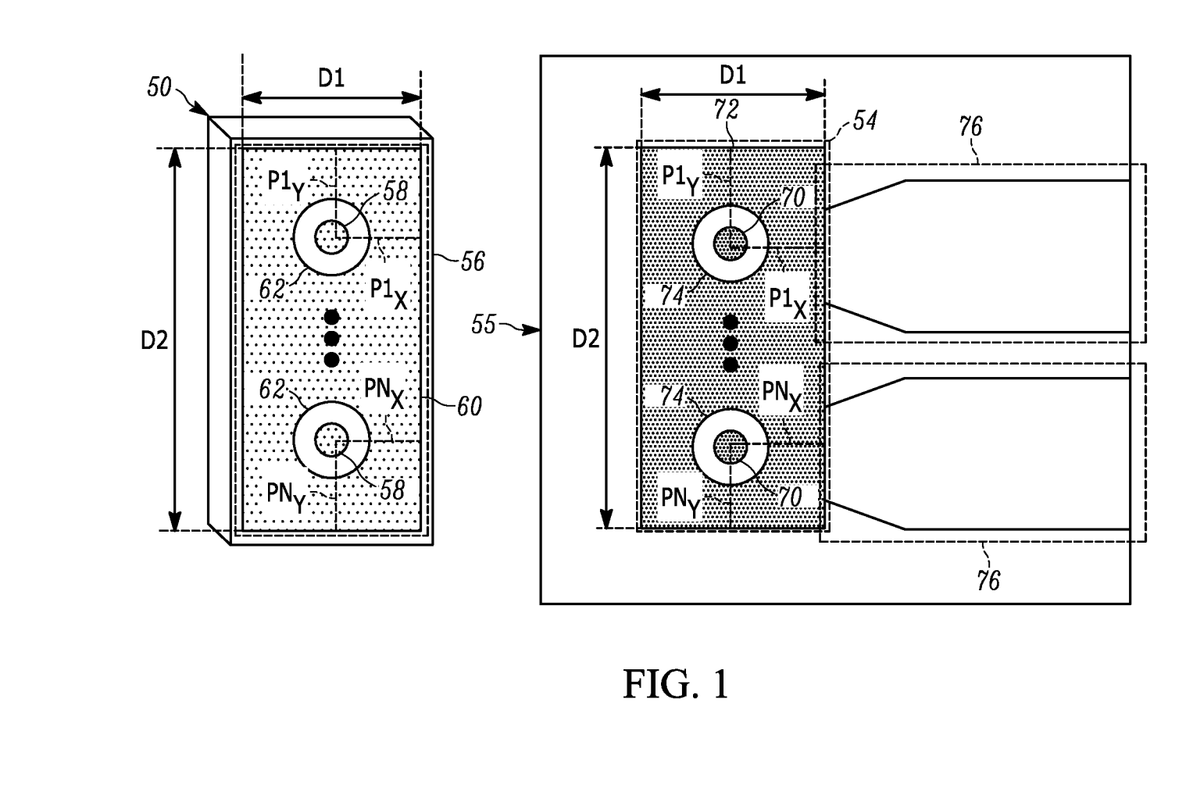
FIG. 1 illustrates a diagram of a surface mount technology (SMT) device for mounting on a printed wiring board (PWB).

FIG. 1 illustrates an example of a surface mount technology (SMT) device 50 that includes an SMT interface 52 that is configured to be mounted (adhered to) a board interface 54 of a printed wiring board (PWB) 55 to form an SMT coax launch. As used herein, the term "SMT coax launch" denotes a specific type of interconnect/interface formed between the SMT device 50 and the PWB 55. That is, as described herein, the SMT coax launch enables transmission of signals between the SMT device 50 and the PWB 55 in a manner that prevents emission of EMI due to radio frequency (RF) leakage.

The SMT device 50 could be, for example, an integrated circuit (IC) chip or a discrete electrical component that is packaged as an SMT device 50. In some examples, the SMT device 50 may be an RF device, such as a mixer, an amplifier, a filter, a directional coupler, etc.

The SMT interface 52 can be substantially planer and affixed to a mounting surface 56 (e.g., a bottom) of the SMT device 50. The SMT interface 52 can include N number of signal pads 58 (connection pads), where N is an integer greater than or equal to one. Each signal pad 58 can be referred to as a signal port, (an input/output port) for the SMT device 50. Each signal pad 58 can be formed at an exposed end of a via in the SMT device 50. Each signal pad 58 can have a substantially circular shape (cross section) or other shape (e.g., a rectangle or square). Each signal pad 58 can be formed of a conductive material (e.g., metalization on substrate, etc.). Moreover, for purposes of simplification of explanation, the N number of signal pads 58 are illustrated in FIG. 1 as being aligned in a single row. However, in other examples, the N number of signal pads 58 can be aligned in a two-dimensional array, or in nearly any other arrangement.

The SMT interface 52 can have nearly any shape. For purposes of simplification of explanation, it is presumed that the SMT interface 52 is rectangular. Thus, the SMT interface 52 can have a first dimension D1 and a second dimension D2 perpendicular to the first dimension D1. Additionally, each of the N number of signal pads 58 can have specific positions on the SMT interface 52. In particular, each of the N number of signal pads 58 can have X-Y co-ordinates that vary as a function of a position relative to an edge of the SMT interface 52. For instance, a first signal pad 58 can have a position $P1_X$, $P1_Y$, wherein the subscripts X and Y denote different dimensions of the SMT interface 52.

The SMT device 50 also includes an interface ground plane 60. The interface ground plane 60 can be formed of the same (or different) conductive material as each of the N number of signal pads 58. In some examples, the interface ground plane 60 can extend to edges (or near the edges) of the mounting surface 56 of the SMT device 50. In other examples, the ground plane 60 may only cover a portion of the mounting surface 56. N number of isolation regions 62 encircle (or otherwise circumscribe) a respective signal pad 58. Each isolation region 62 represents a non-conductive region of the mounting surface 56, which may be formed, for example, from a dielectric material or be an area devoid of conductive material (e.g., a void). Each signal pad 58 and the corresponding isolation region 62 (surrounding clearance) are sufficiently sized to ensure a reliable interface while minimizing the probability of conductive material shorting the signal pad 58 to ground, thus improving manufacturing yields. In some examples, the ground plane 60 may be limited to areas circumscribing the N number of isolation regions 62.

The board interface 54 at the PWB 55 includes a shape that substantially matches the shape of the SMT interface 52. That is, the board interface 54 includes N number of signal pads 70 positioned about an interface ground plane 72. The position of the N number of signal pads 70 on the board interface 54 aligns/matches the position of the N number of signal pads 58 on the SMT interface 52. Similarly, the interface ground plane 72 on the board interface 54 is about the same size and shape as the interface ground plane 60 of the SMT interface 52. Thus, the N number of signal pads 70 on the board interface 54 are each encircled by one of N number of isolation regions 74 of non-conductive material (e.g., a dielectric material).

Since the board interface 54 has the same shape as the SMT interface 52 (e.g., a rectangular shape), the board interface 54 can have substantially the same first dimension D1 and second dimension D2 as the SMT interface 52. Additionally, each of the N number of signal pads 70 of the board interface 54 can have specific positions on the board interface 54. In particular, each of the N number of signal pads 58 can have X-Y coordinates that match X-Y coordinates of corresponding signal pads 58 of the SMT interface 52. For instance, an Nth signal pad 70 can have a position defined by coordinates $PN_X$, $PN_Y$, that substantially matches a coordinates $PN_X$, $PN_Y$ of the Nth signal pad 58 on SMT interface 52.

In the example illustrated, the PWB 55 also includes N number of traces 76 (embedded conductive traces/stripline) etched therein. As explained herein, each of the N number of traces 76 (or some subset thereof) can be positioned within an interior of the PWB 55 (at a layer underlying the board interface 54).

Figure 2:
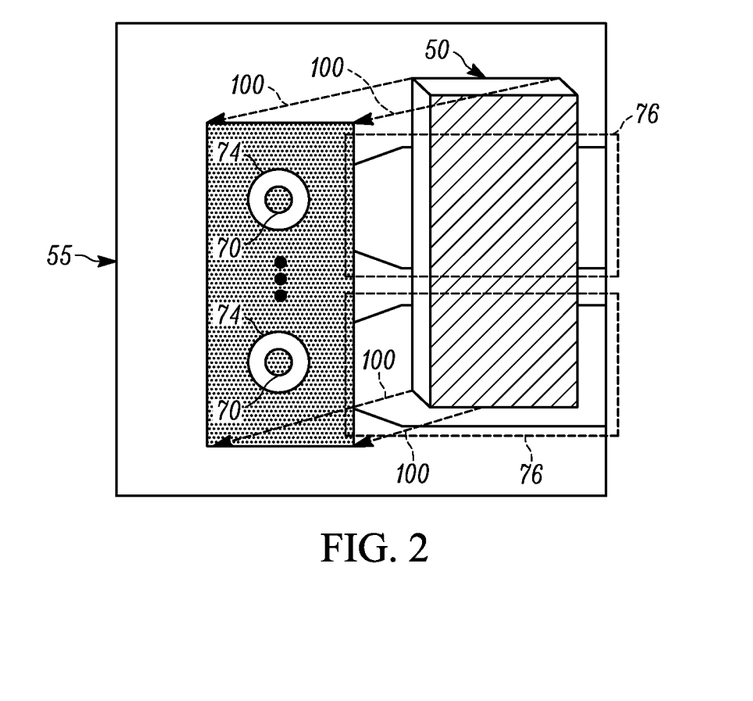
FIG. 2 illustrates another diagram of the SMT device for mounting on the PWB of FIG. 1.
Figure 3:
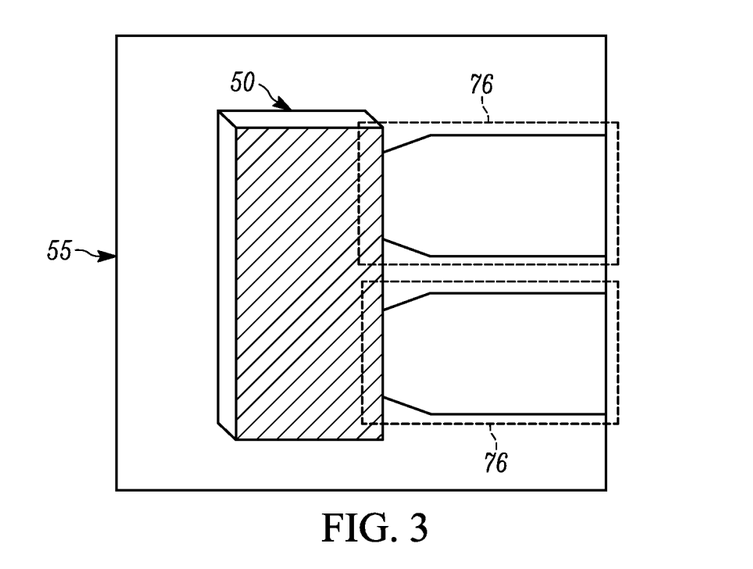
FIG. 3 illustrates a diagram of the SMT device mounted on the PWB of FIG. 1.

To mount the SMT device 50 onto the PWB 55, the SMT device 50 can be "flipped" and positioned over the board interface on the PWB 55. FIG. 2 illustrates an example of aligning the SMT device 50 onto the PWB 55. For purposes of simplification of explanation, the same reference numbers are employed in FIGS. 1-3 to denote the same structure. As illustrated by arrows 100 in FIG. 2, corners of the SMT interface 52 are matched to corners on the board interface 54. The SMT device 50 is mechanically and electrically adhered/coupled to the PWB 55 using conductive material (e.g., solder or electrical epoxy). FIG. 3 illustrates the SMT device 50 mounted on the PWB 55.

By mounting the SMT device 50 to the PWB 55 to form the SMT coax launch (hidden from view), the manner described, an ideal (or nearly ideal) electrical connection is established between the SMT device 50 and the PWB 55. In particular, each of the N signal pads 58 of the SMT interface 52 are electrically connected to the corresponding N number of signal pads 70 on the board interface 54. The electrically conductive material connecting the ground planes 60 and 72 prevents RF leakage between the N number of signals pads and external EMI.

Furthermore, the SMT coax launch (formed by mounting the SMT interface 52 with the board interface 54) obviates the need for any external shielding. That is, no external housing including but not limited to a Faraday cage, an electromagnetic interference (EMI) shield, or a "hut" is needed. Rather, the SMT coax launch provides sufficient RF isolation to allow electrical communication between signal pads 58 of the SMT interface 52 and the signal pads 70 of the board interface 54, such that other components on the PWB 55 (not shown) receive zero (or nearly zero) RF interference. Accordingly, in some examples, the SMT device 50 can be mounted on the PWB 55 with a footprint that is less than twice as large as the area of the board interface 54 for the SMT device 50. In fact, in some examples, the SMT device 50 consumes less than half the board area (e.g., footprint) of PWB 55 than a similarly design SMT device with an EMI shield. Thus, component density on the PWB 55 can be increased.

In fact, as packaging becomes denser, there is an increased need for isolation between SMT devices. For example, quad-flat no-leads (QFN) devices have pads that are not EMI shielded, can couple to adjacent parts or provide a path for EMI to enter your circuit, and allow for interference between pads within the QFN device. To eliminate external RF leakage paths for such an example of the SMT device 50, the SMT coax launch can be employed to allow the SMT device 50 to be (nearly) completely isolated from the environment other components on the PWB 55 (including other SMT devices). This keeps densely packaged parts from coupling or leaking and provides a mechanism to reduce/eliminate EMI without the need for an external EMI shield. By eliminating the need for the EMI shield, space is saved on the surface of the PWB 55 and the weight of the assembly is reduced.

Figure 4:
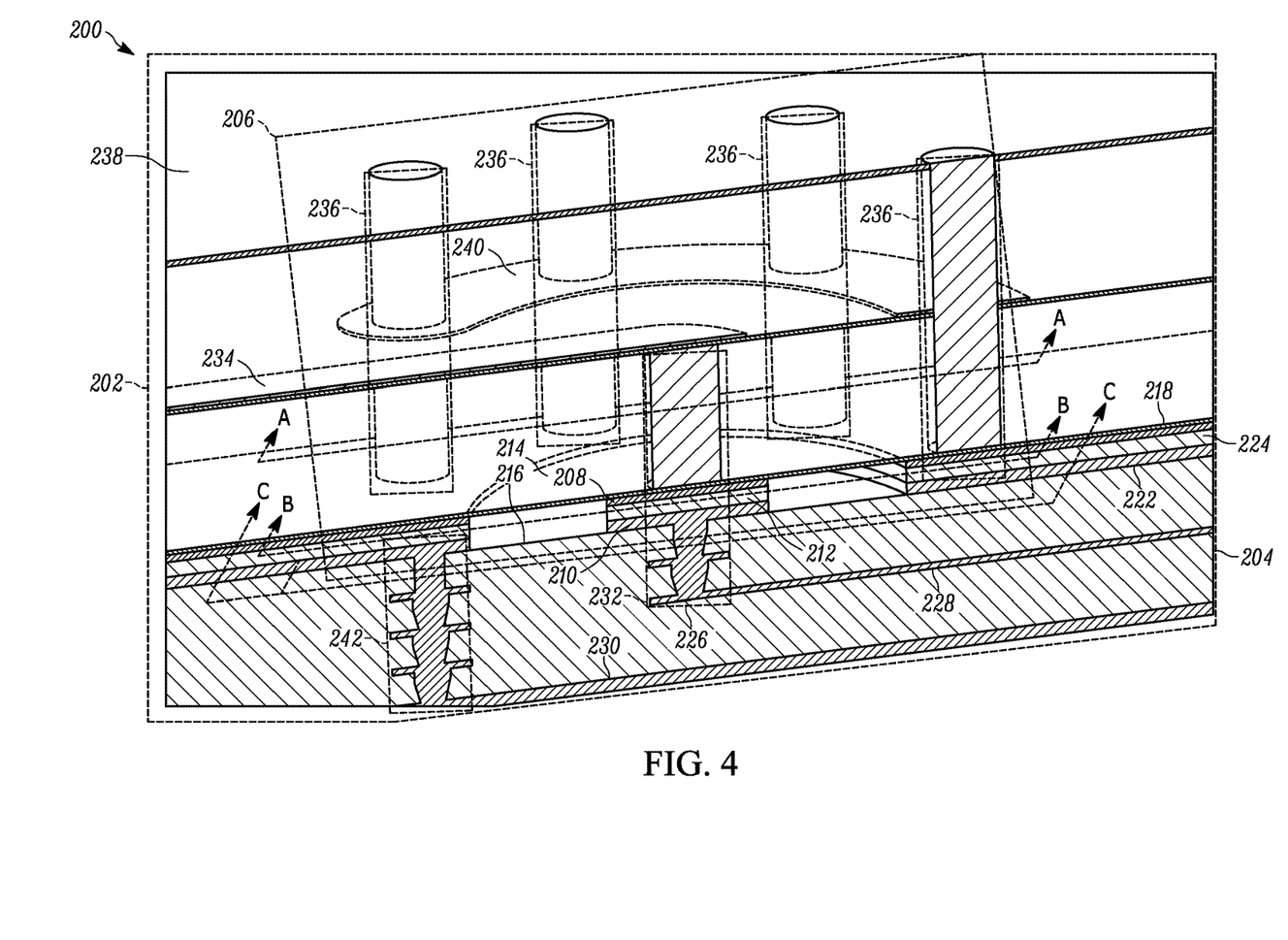
FIG. 4 illustrates a portion of a cross-sectional view of an SMT device mounted on a PWB to form an SMT coax launch.

FIG. 4 illustrates a portion of a cross-sectional view 200 of an SMT device 202 mounted on a PWB 204 to form an SMT coax launch 206. The SMT coax launch 206 could be similar to the SMT coax launch that is hidden from view in FIG. 3. In some examples, the portion of the SMT device 202 illustrated in FIG. 4 can be representative, for example, of a portion of the SMT interface 52 of FIG. 1. Similarly, the portion of the PWB 204 illustrated in FIG. 4 can be representative of a portion of the board interface 54 of FIG. 1.

The SMT device 202 includes a signal pad 208 that is electrically coupled to a signal pad 210 of the PWB 204 through a conductive adhesive 212, such as solder or electrical epoxy. The signal pad 208 of the SMT device 202 is encircled by an isolation region 214 of the SMT device 202. Similarly, the signal pad 210 of the PWB 204 is encircled by an isolation region 216 of the PWB 204. The isolation region 214 of the SMT device 202 and the isolation region 216 of the PWB 204 can each be a non-conductive region, such as a region formed of a dielectric or other insulating material or an absence of conductive material.

An interface ground plane 218 of the SMT device 202 circumscribes the isolation region 214 of the SMT device 202. Similarly, a ground plane 222 of the PWB 204 circumscribes the isolation region of the PWB 204. The ground plane 222 of the PWB 204 can be electrically connected to the interface ground plane 218 of the SMT device 202 through a conductive adhesive 224, such as solder or electrical epoxy. Thus, in some examples, the signal pad 208 of the SMT device 202 and/or the signal pad of the PWB 204 can be formed by applying a layer of conductive material on a surface, and etching away the isolation regions 214 and/or 216.

The signal pad 210 of the PWB 204 can be formed at an end of a signal via 226. The signal via 226 can extend to a trace 228 (e.g., a stripline/embedded conductive trace) of the PWB 204. The trace 228 of the PWB 204 can extend to another region on the PWB 204, such as to another signal pad. Additionally, the ground plane 222 of the PWB 204 can be electrically coupled to an internal ground plane 230 through a ground via 242 (or multiple ground vias hidden from view). In this manner, the signal via 226 is shielded from RF leakage by the ground via 242 (and/or other ground vias hidden from view) forming a pseudo coaxial relationship of the SMT coax launch 206. Additionally as illustrated, the trace 228 is sandwiched between the interface ground plane 222 and the internal ground plane 230. Thus, the trace 228 is shielded by the ground plane 222, the internal ground plane 230, and the ground via 242 (or multiple ground vias) to limit RF leakage.

The signal pad 208 of the SMT device 202 can be formed at an end of a signal via 232 in the SMT device 202. The signal via 232 can be coupled to a trace 234 (e.g., a stripline/embedded conductive trace) in the SMT device 202. The trace 234 may lead to another via, another signal pad, and/or to a component internal to the SMT device 202.

The interface ground plane 218 is coupled to a plurality of ground vias 236. Each of the ground vias 236 are coupled to an internal ground plane 238. The ground vias 236 are positioned in a periodic manner to form a pseudo coaxial relationship between the signal via 232 and the ground vias 236 for the SMT coax launch 206. The distance between the ground vias 236 and the signal via 232 can be selected to achieve a specific characteristic impedance (e.g., about 50 ohms).

As noted, the ground vias 236 are coupled to the internal ground plan 238. In this manner, the trace 234 is sandwiched between the interface ground plane 218 and the internal ground plane 238. Accordingly, the interface ground plane 218, the internal ground plane 238, and ground vias 236 of the SMT device 202 provide shielding for the trace 234 to limit RF leakage.

Furthermore, at a layer at a level equal or nearly equal to a layer of the SMT device 202 on which the trace 234 is formed, the ground vias 236 are coupled to a ground shield 240. The ground shield 240 can have a crescent shape that partially encircles a connection between the signal via 232 and the trace 234. In this manner, the ground shield 240 can prevent RF leakage of current traveling between the signal via 232 and the trace 234.

The SMT coax launch 206 encompasses the features of the SMT device 202 and the PWB 204 that form the interface there between to prevent RF leakage. As illustrated, the SMT coax launch 206 is continued down into the PWB 204 and into the SMT device 202. Accordingly, the SMT coax launch 206 achieves a high isolation interface between the SMT device 202 and the PWB 204. Additionally, the PWB 204 and the SMT device 202 can be designed to easily meet nearly any isolation requirements.

Thus, by employment of the SMT coax launch 206, an ideal or nearly ideal electrical connection is established between the signal pad 208 of the SMT device 202 and the signal pad 210 of the PWB 204. Accordingly, the connection between the signal pad 208 of the SMT device 202 and the signal pad 210 of the PWB 204 emits virtually zero (0) EMI due to RF leakage. In fact, nearly all RF leakage (if any) occurring at the SMT device 202 and/or the PWB 204 occurs at other points. The RF leakage of the interface, comprised of the conductive adhesive 212 and 224 is reduced to a limit defined by the manufacturing process used to attach the SMT device 202 and the PWB 204. As one example, a relatively small RF leakage might occur if a solder void is unintentionally formed that creates an opening in the conductive adhesive 212 that extends between two instances of the isolation region 214 (e.g., the two instances of the isolation regions 74 illustrated in FIG. 1). However, due to tight manufacturing tolerances, such a void is unlikely. The isolation (absence of RF leakage) in practice is usually limited by the PWB and SMT substrate technologies, specifically in the gaps between the ground vias 242 and the gaps between the ground vias 236. The interface between the PWB 204 and the SMT device 202 does not limit isolation, assuming proper attachment techniques.

By employment of the SMT coax launch 206, the need for external shielding, such as a Faraday cage, an EMI shield or a hut can be obviated. Rather, the SMT coax launch 206 provides sufficient RF isolation to allow electrical communication between the signal pad 208 of the SMT device 202 and the signal pad 210 of the PWB that other components on the PWB 204 (out of view) would receive zero (0) (or nearly zero) RF interference induced by RF leakage. Accordingly, in some examples, the SMT device 202 can be mounted on the PWB 204 with a footprint that is less than twice the area of the mounting surface of the SMT device 202. In fact, the SMT device 202 consumes less than half the board area (e.g., footprint) of the PWB 204 as a similarly design SMT device with EMI shield.

In at least one example, the coax launch 206 can achieve electrical isolation of about 90 decibels (dB) or greater for RF signals of up to about 10 gigahertz (GHz) and up to about 60 dB or greater for RF signals of up to about 25 GHz.

Figure 5:
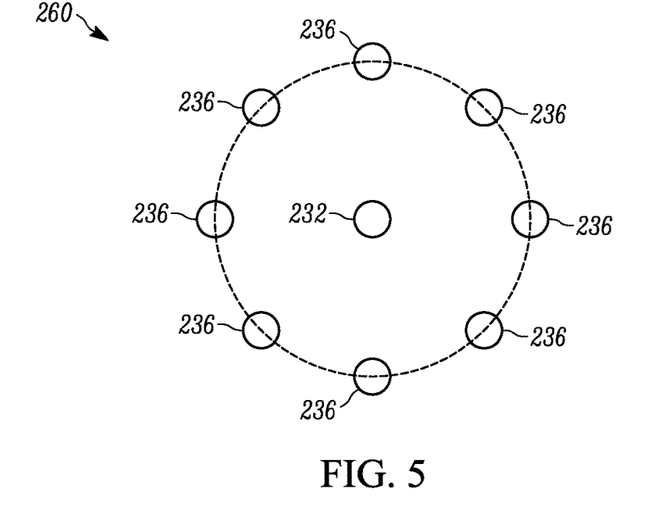
FIG. 5 illustrates a cross sectional view of the SMT coax launch of FIG. 4.

FIG. 5 illustrates a cross sectional view 260 of the SMT coax launch 206 taken along-line A-A, which corresponds to a cross sectional view of the SMT device 202. For purposes of simplification of explanation, the same reference numbers are employed in FIGS. 5-7 to denote the same structure. As illustrated, the ground vias 236 and the signal via 232 provide a pseudo (virtual) coaxial relationship to reduce and/or eliminate external EMI.

Figure 6:
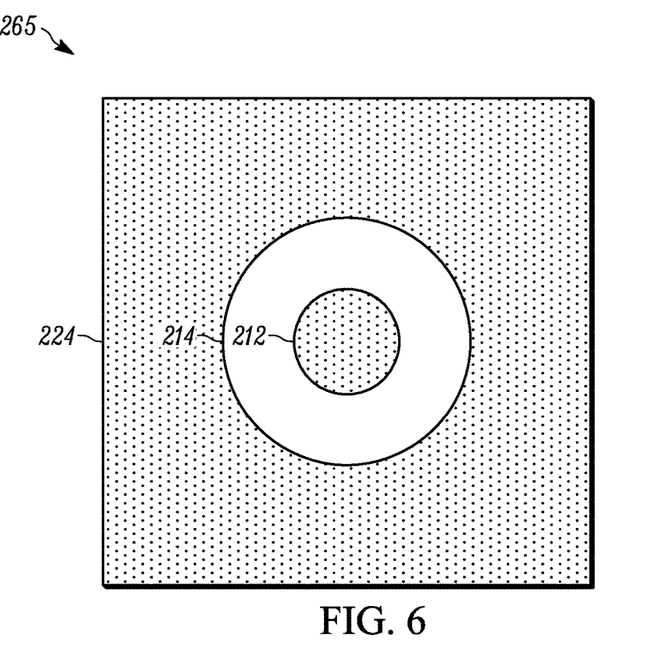
FIG. 6 illustrates another cross sectional view of the SMT coax launch of FIG. 4.

FIG. 6 illustrates a cross sectional view 265 of the SMT coax launch 206 taken along-line B-B, which corresponds to a cross sectional view of the conductive adhesives 212 and 224. As illustrated in FIG. 4, the conductive adhesive 212 is electrically connected to the signal pad 208 of the SMT device 202 and the signal pad 210 of the PWB 204. As illustrated, the conductive adhesive 224 circumscribes the isolation region 214. Moreover, as explained herein the conductive adhesives 212 and 224 (when properly manufactured) provide a nearly ideal (virtually no RF leakage) connection between the signal pad 210 of the PWB 204 and to the signal pad 208 of the SMT device 202.

Figure 7:
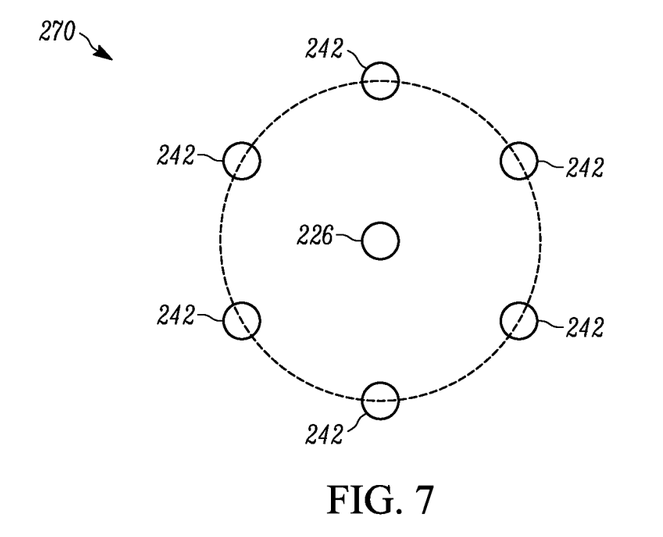
FIG. 7 illustrates yet another cross sectional view of the SMT coax launch of FIG. 4.

FIG. 7 illustrates a cross sectional view 270 of the SMT coax launch 206 taken along-line C-C, which corresponds to a cross sectional view of the PWB 204. As illustrated, the ground vias 242 and the signal via 226 provide a pseudo (virtual) coaxial relationship to reduce and/or eliminate external EMI.

Figure 8:
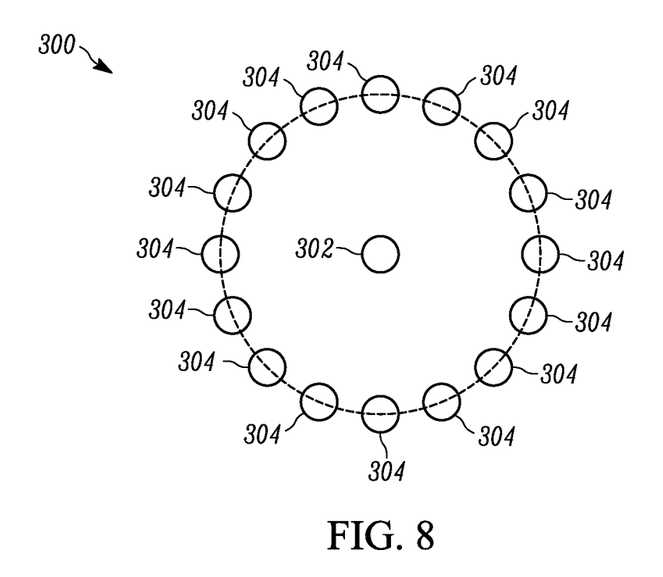
FIG. 8 illustrates a cross-sectional view of a coax launch.

FIG. 8 illustrates an alternate cross-sectional view 300 of a coax launch that could be employed in an SMT device (e.g., the SMT device 202 of FIG. 4) and/or a PWB (e.g., the PWB 204 of FIG. 4) to further reduce RF leakage (and increase electrical isolation). In the view 300, a signal via 302 is surrounded by ground vias 304 that are relatively tightly positioned about a circle indicated at 306. Such a tight coupling further reduces RF leakage (as compared to the views 260 and 265 of FIGS. 5 and 6).

Figure 9:
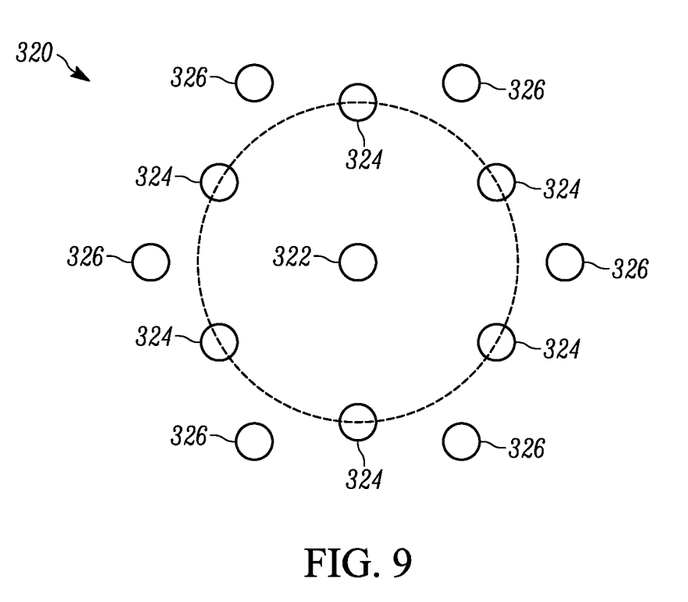
FIG. 9 illustrates another cross-sectional view of a coax launch.

FIG. 9 illustrates another alternate cross-sectional view 320 of a coax launch that could be employed in an SMT device (e.g., the SMT device 202 of FIG. 4) and/or a PWB (e.g., the PWB 204 of FIG. 4) to further reduce RF leakage (and increase electrical isolation). In the view 320, a signal via 322 is surrounded by a first circumferential row of ground vias 324 and a second circumferential row of ground vias 326. Moreover, as illustrated, the ground vias 326 in the second circumferential row are positioned in gaps between ground vias 325 in the first circumferential row. Inclusion of two rows of ground vias 324 and 326 further reduces RF leakage (as compared to the views 260 and 265 of FIGS. 5 and 6). Additionally, in other examples, more than two rows of ground vias can be included to further improve electrical isolation. As illustrated in FIGS. 5-9, a desired electrical isolation for the coax launch described herein can be achieved by selecting a number and arrangement of ground vias that select a signal via.

Figure 10:
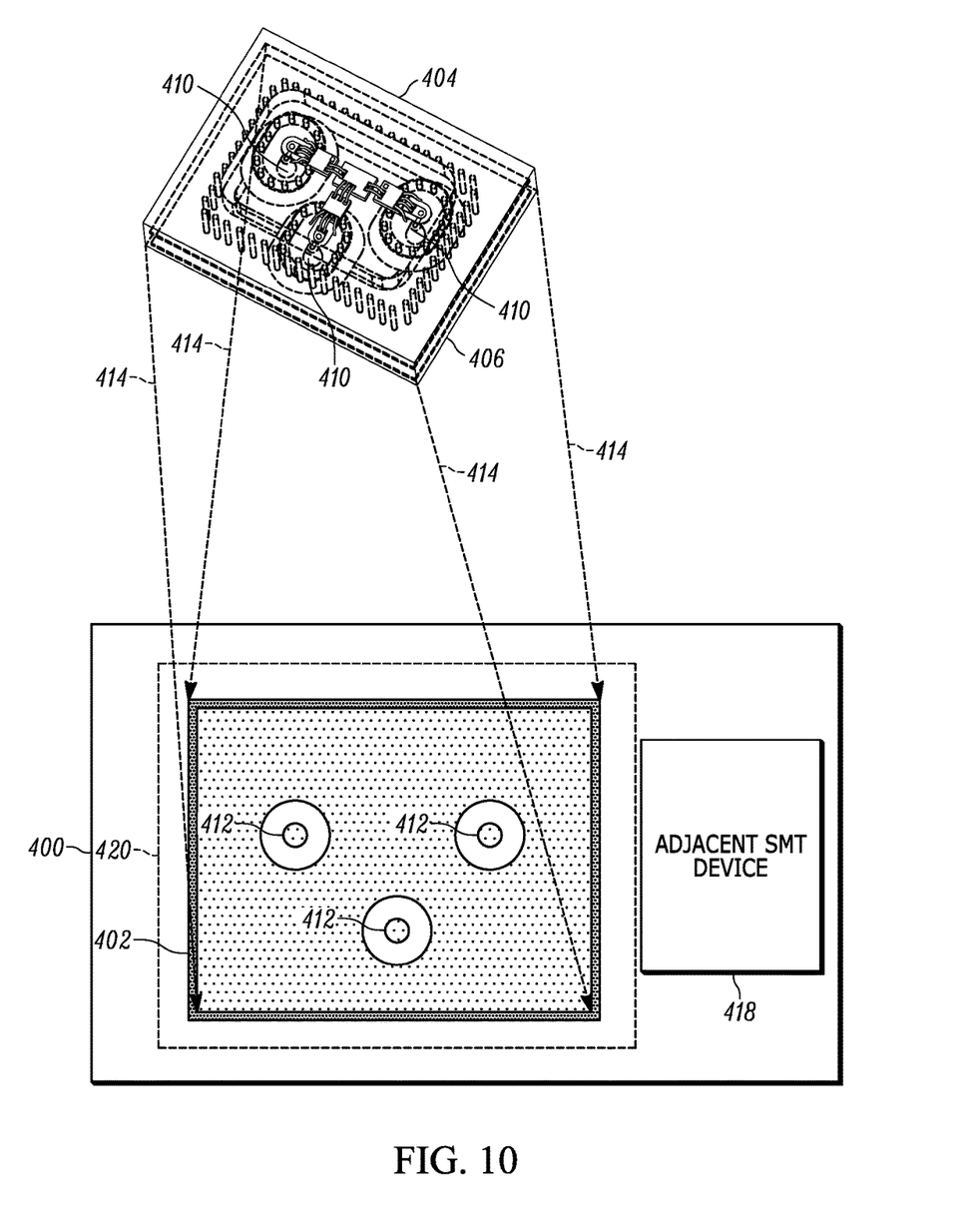
FIG. 10 illustrates a diagram of a PWB that receives an SMT device.

FIG. 10 illustrates an example of a PWB 400 that includes a board interface 402 (e.g., the board interface 54 of FIG. 1) configured (etched/shaped) to receive an SMT device 404 with an SMT interface 406 (e.g., the SMT interface 52 of FIG. 1) to an SMT coax launch (e.g., the SMT coax launch 206 of FIG. 4). In the example illustrated, the SMT coax launch electrically couples three (3) signal pads 410 of the SMT device 404 with corresponding signal pads 412 of the board interface 402. To facilitate understanding, the SMT device 404 is illustrated as being translucent. However, it is to be understood that in practice, the SMT device 404 may be opaque.

To mount the SMT device 404 onto the PWB 400, corners of the SMT device 404 can be aligned with corners of the board interface 402, as indicated by the arrows 414 and a conductive adhesive (e.g., solder or conductive epoxy) can be used to bind the SMT device 404 with the PWB 400.

The PWB 400 can also include an adjacent SMT device 418. The adjacent SMT device 418 could be nearly any SMT device, including an IC chip, a discrete component, etc. Additionally, a "keepout region" 420 is marked on the PWB 400. The keepout region 420 circumscribes the board interface 402 and defines a minimum distance between the SMT device 404 (mounted on the PWB 400) and other components to avoid EMI, including the adjacent SMT device 418. The keepout region 420 defines an area where no other component (other than the SMT device 404) is to be positioned to avoid EMI being propagated from the SMT device 404 to the other device. The keepout region 420 may also define borders of a footprint of the SMT device 404. That is, as used herein, the footprint of the SMT device 404 includes the area of the PWB 400 covered by the SMT device 402, as well as the area of the keepout region 420.

The size of the keepout region 420 can be based on the type of SMT device 404. In the example illustrated, the SMT device 404 could be a Ka-band mixer IC chip (package). If the SMT coax launch were not included, an external shield, such as an EMI shield, a Faraday cage or a hut would be needed to prevent RF leakage to components. Such an external shield would increase the keepout region size, thereby increasing an amount of PWB 400 real-estate needed for mounting. Conversely, by employing the SMT coax launch, a relatively small footprint defined by the border of the keepout region 420 is needed. The employment of the external shield may increase the footprint size at least 50%. In some examples, the keepout region 420 may encompass less than twice as much area (real-estate) on the PWB 400 as the board interface 402 for the SMT device 404. For instance, in some examples, the keepout region 420 may extend beyond an edge of the SMT device 402 by about 0.5 millimeters. Thus, employment of the SMT coax launch reduces EMI caused by RF leakage, which in turn allows more efficient use of the real-estate available on the PWB 400.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A surface mount technology (SMT) device comprising:
    an SMT interface on a given side of the SMT device, the SMT interface comprising: an interface ground plane formed of conductive material; and
    a plurality of signal pads formed of the conductive material, wherein each signal pad is encircled by one of a plurality of isolation regions formed from a non-conductive material;
    wherein the SMT device is mounted on a printed wiring board (PWB) that includes a board interface having substantially the same shape at the SMT interface;
    wherein a given signal pad of the plurality of signal pads is encircled by a given isolation region of the plurality of isolation regions and the given signal pad is connected to a given via extending in a given axis of the SMT device and the interface ground plane is connected to a plurality of vias extending in a direction parallel to the given axis of the SMT device and being positioned to surround the given isolation region associated with the given signal pad to form a pseudo-coaxial relationship between the given via and the plurality of vias: and
    wherein each of the plurality of vias are connected to the interface ground plane, an internal ground plane and a grounding shield of the SMT device.

2. The SMT device of claim 1, wherein each of the plurality of signal pads is positioned at a selected location relative to the edges of the SMT device.

3. The SMT device of claim 1, wherein each of the plurality of signal pads is connected to a corresponding via of the SMT device.

4. The SMT device of claim 1, wherein the given via is also coupled to a trace of the SMT device, wherein the trace is positioned at a given level within the SMT device.

5. The SMT device of claim 1, wherein the grounding shield has a crescent shape that partially circumscribes a connection between the given via and the SMT device.

6. The SMT device of claim 4, wherein the given level is sandwiched between the interface ground plane and the internal ground plane.

7. The SMT device of claim 4, wherein each of the plurality of vias connected to the interface ground plane are connected to the internal ground plane on a level of the SMT device overlying the given level.

8. A printed wiring board (PWB) comprising:
    a board interface that receives a surface mount technology (SMT) device, the board interface having a substantially rectangular shape, the board interface comprising:
    an interface ground plane formed of conductive material; and
    a plurality of signal pads formed of the conductive material, wherein each signal pad is circumscribed by one of a plurality of isolation regions formed from a non-conductive material;
    wherein the SMT device includes an SMT interface that has substantially the same shape as the board interface;
    wherein a given signal pad of the plurality of signal pads is encircled by a given isolation region of the plurality of isolation regions and the given signal pad is connected to a given via extending in a given axis of the PWB and the interface ground plane is connected to a plurality of vias extending in a direction parallel to the given axis of the PWB and being positioned to surround the given isolation region associated with the given signal pad to form a pseudo-coaxial relationship between the given via and the plurality of vias: and
    wherein each of the plurality of vias are connected to the interface ground plane and an internal ground plane of the PWB.

9. The PWB of claim 8, further comprising:
    a keepout region circumscribing the board interface, wherein the keepout region defines a substantially minimum distance between the SMT device and another component mounted on the PWB.

10. The PWB of claim 8, wherein a size of the keepout region encompasses less than twice the area of the board interface.

11. The PWB of claim 8, wherein each of the plurality of signal pads is connected to a corresponding via of the PWB.

12. The PWB of claim 11, wherein the given signal pad of the plurality of signal pads is coupled to a given trace on the PWB at a given level.

13. The PWB of claim 12, wherein the given trace is sandwiched between the interface ground plane and the internal ground plane.

14. An apparatus comprising:
    a surface mount technology (SMT) device comprising an SMT interface on a given side of the SMT device, the SMT interface comprising:
    a ground plane formed of conductive material extending to about each edge of the given side of the SMT device; and
    a plurality of signal pads formed of the conductive material, each of the plurality of signals pads being encircled by a corresponding one of a plurality of isolation regions formed from a non-conductive material;
    a printed wiring board (PWB) having a board interface having substantially a same shape as the SMT interface, wherein the SMT device is mounted on the PWB at the location of the board interface, a given signal pad of the plurality of signal pads forming a SMT coax launch in the SMT device and PWB that electrically couples the signal pad of the SMT device to a signal pad on the board interface;
    wherein the SMT coax launch comprises a plurality of vias, a first subset of the plurality of vias extending from the SMT interface and into the SMT device in a direction parallel to a given axis and a second subset of the plurality of vias extending from the board interface and into the PWB in a direction parallel to the given axis.

15. The apparatus of claim 14, wherein the SMT device is adhered to the PWB with one of solder and an electrical epoxy.

16. The apparatus of claim 14, wherein the SMT coax launch prevents radio frequency (RF) leakage of signals transmitted between the signal pad of the SMT device and the signal pad of the PWB.

17. The apparatus of claim 14, wherein the SMT device is an RF mixer, and the SMT device has a footprint that is less than twice an area of the board interface.

\* \* \* \* \*